(12) United States Patent
Jang

(10) Patent No.: US 11,594,516 B2
(45) Date of Patent: Feb. 28, 2023

(54) SEMICONDUCTOR PACKAGE AND METHOD OF MANUFACTURING SEMICONDUCTOR PACKAGE

(71) Applicant: Samsung Electronics Co., Ltd., Suwon-si (KR)

(72) Inventor: Aenee Jang, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 11 days.

(21) Appl. No.: 17/245,978

(22) Filed: Apr. 30, 2021

(65) Prior Publication Data

US 2022/0068881 A1   Mar. 3, 2022

(30) Foreign Application Priority Data

Sep. 3, 2020 (KR) .................. 10-2020-0112238

(51) Int. Cl.
| | | |
|---|---|---|
| *H01L 23/00* | (2006.01) | |
| *H01L 25/065* | (2023.01) | |
| *H01L 23/31* | (2006.01) | |
| *H01L 23/498* | (2006.01) | |

(52) U.S. Cl.
CPC ...... *H01L 25/0655* (2013.01); *H01L 23/3192* (2013.01); *H01L 23/49816* (2013.01); *H01L 24/16* (2013.01); *H01L 24/32* (2013.01); *H01L 24/73* (2013.01); *H01L 2224/16227* (2013.01);
(Continued)

(58) Field of Classification Search
CPC ............. H01L 25/0655; H01L 23/3192; H01L 23/49816; H01L 24/16; H01L 24/32; H01L 24/73; H01L 2224/16227; H01L 2224/32225; H01L 2224/73204; H01L 2924/3512; H01L 23/5383; H01L 23/5385; H01L 2221/68327; H01L 2221/68345; H01L 21/561; H01L 21/563; H01L 21/568; H01L 21/6835; H01L 23/3128; H01L 23/16; H01L 23/13; H01L 23/31; H01L 23/481; H01L 23/49827; H01L 23/525; H01L 23/528; H01L 24/97; H01L 25/0652
See application file for complete search history.

(56) References Cited

U.S. PATENT DOCUMENTS

| | | |
|---|---|---|
| 9,275,950 B2 | 3/2016 | Kuo et al. |
| 10,153,222 B2 | 12/2018 | Yu et al. |
| 10,510,714 B2 | 12/2019 | Tang et al. |

(Continued)

*Primary Examiner* — Elias Ullah
(74) *Attorney, Agent, or Firm* — Muir Patent Law, PLLC

(57) ABSTRACT

A semiconductor package includes a package substrate, an interposer provided on the package substrate, a plurality of semiconductor devices on the interposer and spaced apart from each other, and electrically connected to each other through the interposer, at least one dummy member on the interposer to cover at least one corner portion of the interposer and arranged spaced apart from a first semiconductor device among the plurality of semiconductor devices, and a sealing member contacting the interposer and filling a space between the first semiconductor device and the at least one dummy member so as to cover a first side surface of the first semiconductor device, a first side surface of the at least one dummy member, and an upper surface of the dummy member. A second side surface, opposite to the first side surface, of the at least one dummy member is uncovered by the sealing member.

19 Claims, 19 Drawing Sheets

(52) U.S. Cl.
CPC ............ *H01L 2224/32225* (2013.01); *H01L 2224/73204* (2013.01); *H01L 2924/3512* (2013.01)

(56) References Cited

U.S. PATENT DOCUMENTS

| | | |
|---|---|---|
| 10,529,690 B2 | 1/2020 | Shih et al. |
| 10,651,131 B2 | 5/2020 | Chen et al. |
| 10,685,921 B2 | 6/2020 | Jee et al. |
| 2014/0103517 A1 | 4/2014 | Park et al. |
| 2018/0138151 A1* | 5/2018 | Shih ................ H01L 25/50 |
| 2019/0237412 A1 | 8/2019 | Lee |
| 2020/0006252 A1 | 1/2020 | Yu et al. |

* cited by examiner

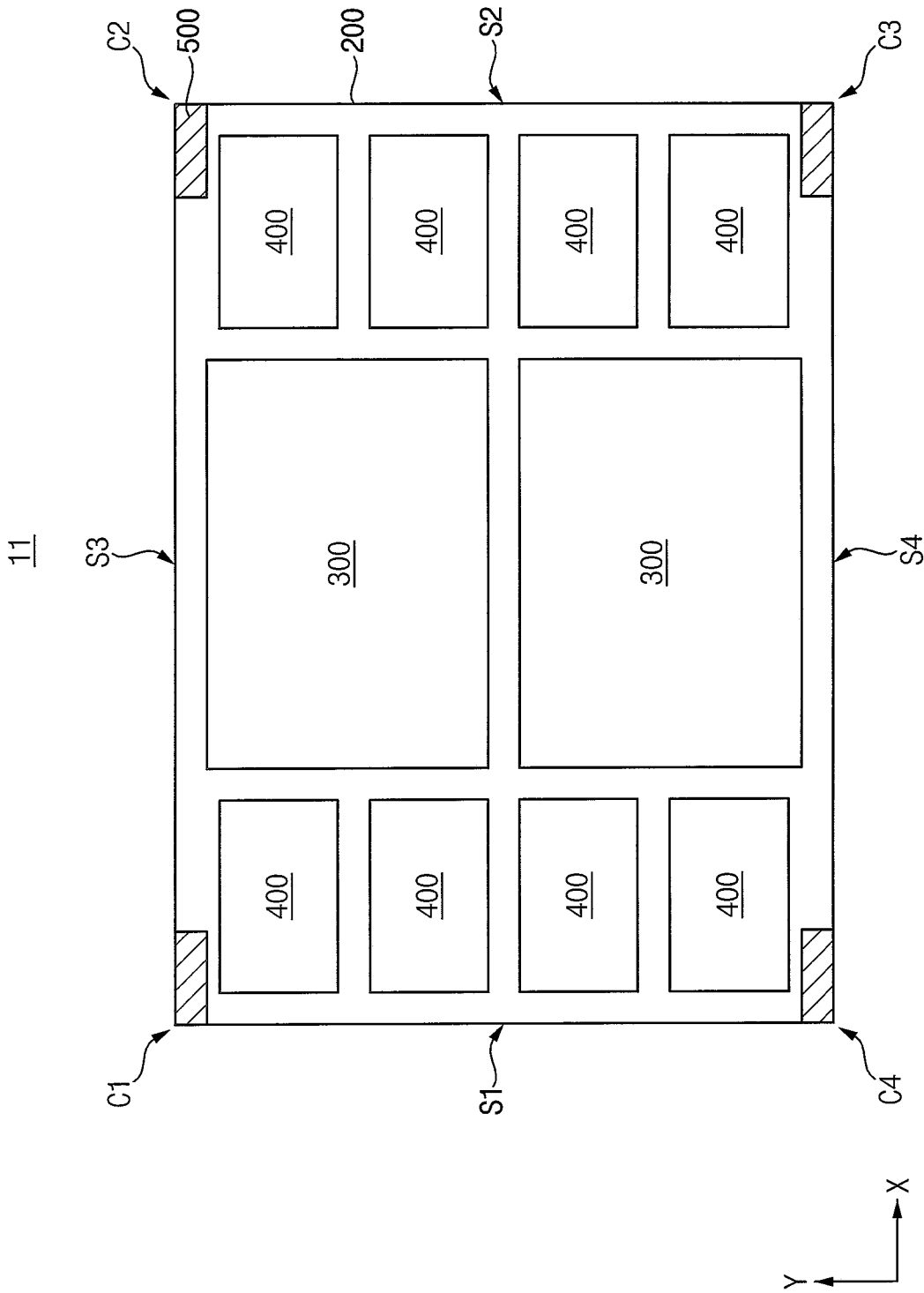

SEMICONDUCTOR PACKAGE AND METHOD OF MANUFACTURING SEMICONDUCTOR PACKAGE

PRIORITY STATEMENT

This application claims priority under 35 U.S.C. § 119 to Korean Patent Application No. 10-2020-0112238, filed on Sep. 3, 2020 in the Korean Intellectual Property Office (KIPO), the contents of which are herein incorporated by reference in their entirety.

BACKGROUND

1. Field

Example embodiments relate to a semiconductor package and a method of manufacturing the semiconductor package. More particularly, example embodiments relate to a semiconductor package including a plurality of different chips stacked on a package substrate using an interposer and a method of manufacturing the same.

2. Description of the Related Art

An electronic device includes a high bandwidth memory and a stacked chip package to provide high performances such as a high capacitance and a high speed. A package used for such an electronic device may be provided with a high density interconnection using an extra substrate, such as a silicon interposer. However, as the number of semiconductor devices disposed on the interposer increases and an area of the interposer increases, warpage may occur due to a difference in coefficients of thermal expansion (CTE) between individual components constituting the package, and cracks may occur in the molded interposer during a temperature cycle (TC) test.

SUMMARY

Example embodiments provide a semiconductor package including a molded interposer capable of improving reliability.

Example embodiments provide a method of manufacturing the semiconductor package.

According to example embodiments, a semiconductor package includes a package substrate having a top surface and a bottom surface opposite to the top surface, an interposer provided on the top surface of the package substrate, a plurality of semiconductor devices on the interposer spaced apart from each other, and electrically connected to each other through the interposer, at least one dummy member on the interposer to cover at least one corner portion of the interposer and arranged spaced apart from a first semiconductor device among the plurality of semiconductor devices, and a sealing member contacting the interposer and filling a space between the first semiconductor device and the at least one dummy member so as to cover a first side surface of the first semiconductor device, a first side surface of the at least one dummy member, and an upper surface of the at least one dummy member, wherein a second side surface, opposite to the first side surface, of the at least one dummy member is uncovered by the sealing member.

According to example embodiments, a semiconductor package includes a package substrate having a top surface and a bottom surface opposite to the top surface, an interposer arranged on the top surface of the package substrate and having a plurality of first bonding pads and second bonding pads provided respectively on a first surface and a second surface opposite to each other and electrically connected to each other, a plurality of semiconductor devices on the first surface of the interposer, arranged spaced apart from each other and electrically connected to the first bonding pads, an underfill member interposed between the semiconductor devices and the first surface of the interposer and including a vertical extension covering a portion of a sidewall of the semiconductor devices, at least one dummy member on the first surface of the interposer covering at least one corner portion of the interposer and arranged spaced apart from a first semiconductor device among the plurality of semiconductor devices and the underfill member, and a sealing member contacting the first surface of the interposer and filling a space between the first semiconductor device and the at least one dummy member so as to contact the vertical extension covering a portion of a sidewall of the first semiconductor device, contact the sidewall of the first semiconductor device, contact an upper surface of the at least one dummy member, and contact a first side surface of the at least one dummy member, wherein a second side surface, opposite to the first side surface, of the at least one dummy member is not contacting the sealing member.

According to example embodiments, a semiconductor package includes a package substrate having a top surface and a bottom surface opposite to the top surface, an interposer provided on the top surface of the package substrate, a first semiconductor device arranged in a middle region of the interposer, a second semiconductor device arranged on a side of the first semiconductor device on the interposer, a first underfill member interposed between the second semiconductor devices and the interposer and including a first vertical extension covering a portion of a sidewall of the second semiconductor device, at least one dummy block on the interposer covering at least one corner portion of the interposer and arranged spaced apart from the second semiconductor device and the first underfill member, a sealing member contacting the interposer and filling a space between the second semiconductor device and the at least one dummy block so as to cover a portion of the sidewall of the second semiconductor device, a first sidewall of the at least one dummy block, and upper surface of the at least one dummy block, and a second underfill member interposed between the interposer and the package substrate, and including a second vertical extension covering a portion of a second sidewall, opposite to the first sidewall, of the at least one dummy block. The second sidewall of the at least one dummy block is uncovered by the sealing member, and a height, in a direction perpendicular to the top surface of the package substrate, of the at least one dummy block is within a range of 50% to 90% of a height of the second semiconductor device.

According to example embodiments, a semiconductor package may include an interposer, a plurality of semiconductor devices arranged on the interposer, at least one dummy member covering at least one corner portion of the interposer and spaced apart from a first semiconductor device among the plurality of semiconductor devices, and a sealing member contacting the interposer and filling a space between the first semiconductor device and the at least one dummy member so as to cover a first side surface of the first semiconductor device, a first side surface of the at least one dummy member, and an upper surface of the at least one dummy member. A height of the dummy member may be less than a height of the semiconductor device. A second side surface, opposite to the first side surface, of the at least one dummy member is uncovered by the sealing member.

Accordingly, during a reliability test such as a temperature cycle (TC) test, the dummy member may act as a barrier against bending stress that causes a failure, to thereby prevent occurrence of cracks between an underfill member and the sealing member. Thus, it may be possible to improve the reliability of the semiconductor package.

BRIEF DESCRIPTION OF THE DRAWINGS

Example embodiments will be more clearly understood from the following detailed description taken in conjunction with the accompanying drawings. FIGS. 1 to 20 represent non-limiting, example embodiments as described herein.

FIG. 1 is a cross-sectional view illustrating a semiconductor package in accordance with example embodiments.

FIG. 2 is a plan view illustrating the semiconductor package in FIG. 1.

FIG. 3 is an enlarged cross-sectional view illustrating portion 'A' in FIG. 1.

FIGS. 4 to 16 are cross-sectional views illustrating a method of manufacturing a semiconductor package in accordance with example embodiments.

FIG. 17 is a plan view illustrating a dummy member in accordance with example embodiments.

FIGS. 18 and 19 are plan views illustrating a dummy member in accordance with example embodiments.

FIG. 20 is a cross-sectional view illustrating a semiconductor package in accordance with example embodiments.

DETAILED DESCRIPTION OF EXAMPLE EMBODIMENTS

Hereinafter, example embodiments will be explained in detail with reference to the accompanying drawings.

Figure 1:
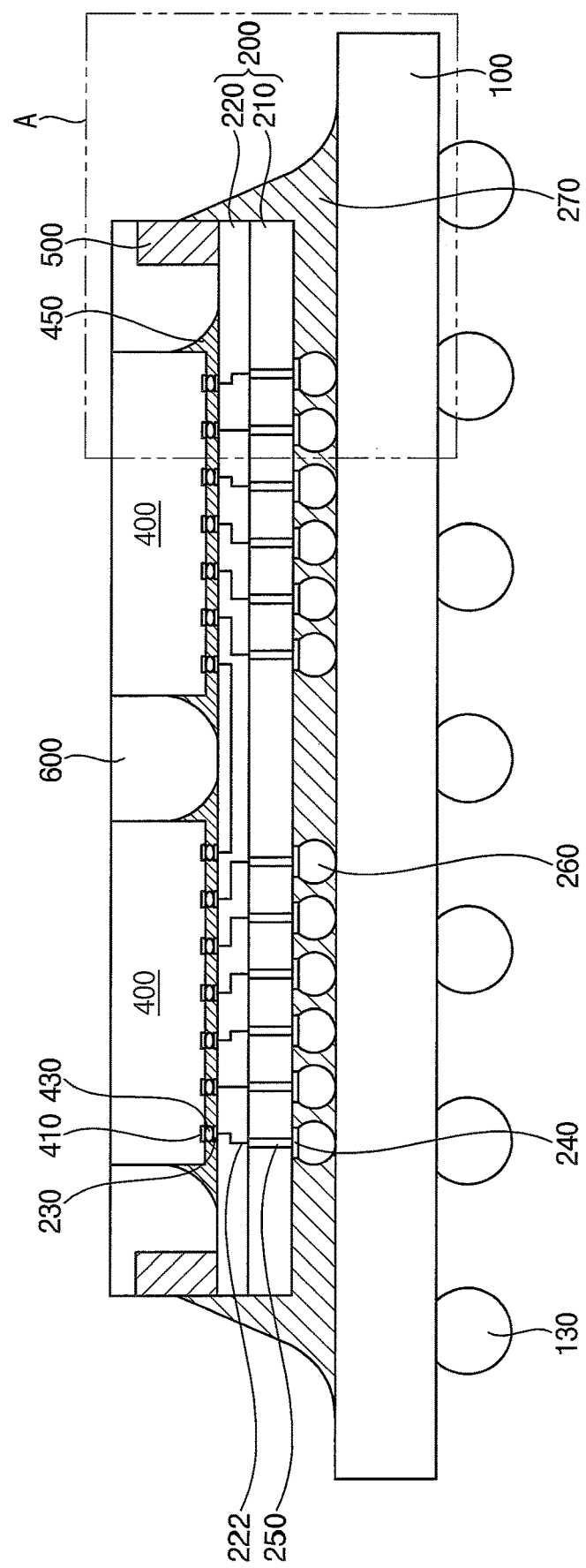
Figure 2:
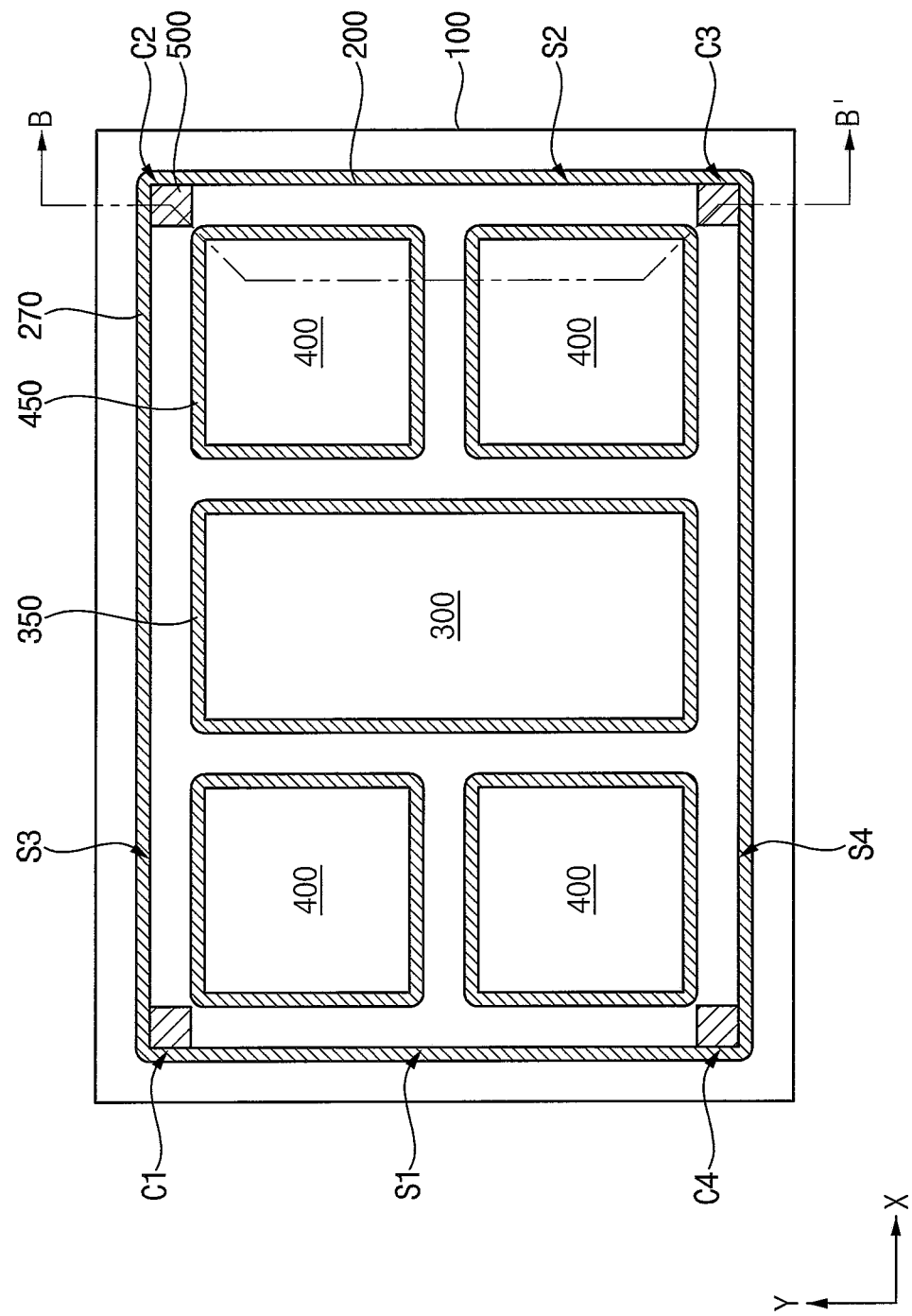
Figure 3:
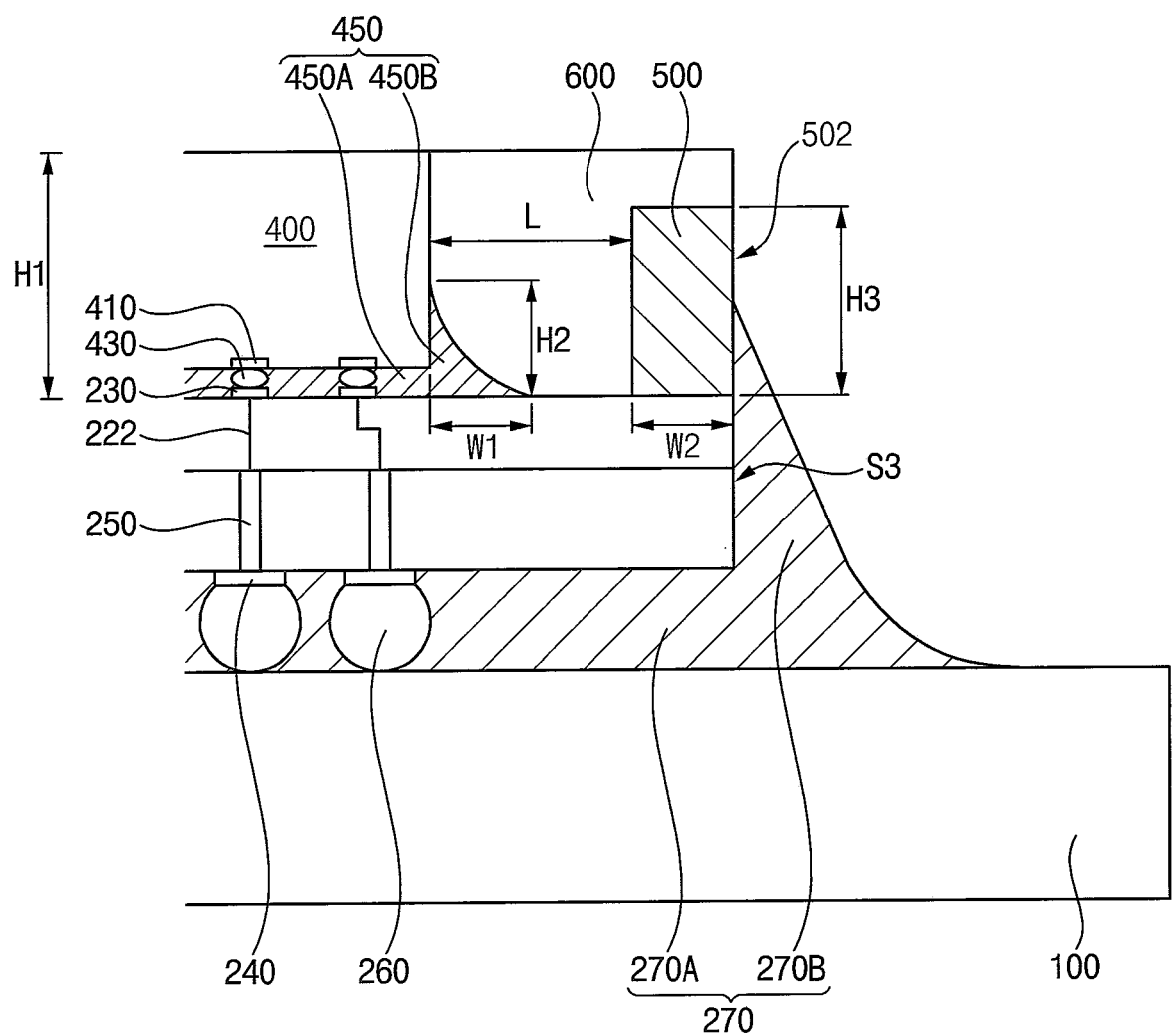

FIG. 1 is a cross-sectional view illustrating a semiconductor package in accordance with example embodiments. FIG. 2 is a plan view illustrating the semiconductor package in FIG. 1. FIG. 3 is an enlarged cross-sectional view illustrating portion 'A' in FIG. 1. FIG. 1 is a cross-sectional view taken along the line B-B' in FIG. 2.

Referring to FIGS. 1 to 3, a semiconductor package 10 may include a package substrate 100, an interposer 200, a first semiconductor device 300, second semiconductor devices 400, a dummy member 500 and a sealing member 600. Additionally, the semiconductor package 10 may further include first and second underfill members 350, 450 and a third underfill member 270.

In example embodiments, the semiconductor package 10 may be a memory device having a stacked chip structure in which a plurality of dies (chips) are stacked. For example, the semiconductor package 10 may include a semiconductor memory device with a 2.5D chip structure. 2.5D refers to a packaging methodology in which a plurality of dies (chips) are integrated into a single package by assembling at least some of them side-by-side on a shared base (e.g., an interposer). The interposer may contain circuitry to electrically connect the plurality of dies (chips) to each other and to devices external to the package. In this case, the first semiconductor device 300 may include a logic semiconductor device, and the second semiconductor device 400 may include a memory device. The logic semiconductor device may include a CPU, a GPU, an ASIC, or an SOC. The memory device may include a high bandwidth memory (HBM) device.

In example embodiments, the package substrate 100 may be a substrate having an upper surface and a lower surface opposite to each other. For example, the package substrate 100 may be a printed circuit board (PCB). The PCB may be a multilayered circuit board including vias and various circuits therein.

The interposer 200 may be disposed on the package substrate 100. The interposer 200 may be mounted on the package substrate 100 through solder bumps 260. A planar area of the interposer 200 may be less than a planar area of the package substrate 100. The interposer 200 may be disposed within the area of the package substrate 100 in plan view.

The interposer 200 may be a silicon interposer or a redistribution interposer including a plurality of wirings therein. The first semiconductor device 300 and the second semiconductor devices 400 may be connected to each other through the wirings and may be electrically connected to the package substrate 100 through the solder bumps 260. The interposer 200 may provide a high density interconnection between the first and second semiconductor devices 300 and 400.

In example embodiments, the interposer 200 may include a semiconductor substrate 210, a wiring layer 220 including a plurality of wirings 222 on an upper surface of the semiconductor substrate 210, a plurality of first bonding pads 230 provided on the wiring layer 220 and a plurality of second bonding pads 240 provided on a lower surface of the semiconductor substrate 210.

For example, the interposer 200 may have an area of 20 mm×30 mm or more. The substrate 210 may include or may be formed of silicon, germanium, silicon-germanium, or III-V compounds, e.g., GaP, GaAs, GaSb, etc. In some embodiments, the substrate 210 may be a silicon-on-insulator (SOI) substrate, or a germanium-on-insulator (GOI) substrate.

The wiring layer 220 may include a plurality of insulation layers and a plurality of wirings 222 in the insulation layers. For example, the wirings 222 may include or may be formed of a metal such as copper Cu.

The semiconductor substrate 210 may include a plurality of through electrodes 250 penetrating therethrough. The through electrode 250 may include a through silicon via. The through electrode 250 may be provided to extend in a thickness direction from (e.g., a direction perpendicular to) a first surface of the semiconductor substrate 210. An end portion of the through electrode 250 may contact the wiring 222 of the wiring layer 220. The terms "contact," "contacting," or "in contact with," as used herein, refers to a direct connection (i.e., touching) without any intervening elements present at the point of contact unless the context indicates otherwise.

The interposer 200 may be mounted on the package substrate 100 via the solder bumps 260. The solder bump 260 may be formed on the second bonding pad 240. For example, the solder bump 260 may include C4 (controlled collapse of chip connection) bump. The second bonding pad 240 of the interposer 200 may be electrically connected to a substrate pad of the package substrate 100 by the solder bump 260.

In example embodiments, the first semiconductor device 300 may be arranged on the interposer 200. The first semiconductor device 300 may be mounted on the interposer 200 in a flip chip bonding manner. In this case, the first semiconductor device 300 may be mounted such that an active surface of the first semiconductor device 300 on which chip pads are formed face the interposer 200. The chip pads of the first semiconductor device 300 may be electrically connected to the first bonding pads 230 of the interposer 200 by conductive bumps. For example, the conductive bumps may include a micro bump (uBump). A micro bump may have a bump pitch of approximately 60 μm or less.

The second semiconductor devices 400 may be arranged on the interposer 200 to be spaced apart from the first semiconductor device 300. The second semiconductor devices 400 may be mounted on the interposer 200 in a flip chip bonding manner. In this case, the second semiconductor device 400 may be mounted such that an active surface of the second semiconductor device 400 on which chip pads 410 are formed face the interposer 200. The chip pads 410 of the second semiconductor device 400 may be electrically connected to the first bonding pads 230 of the interposer 200 by conductive bumps 430. For example, the conductive bumps 430 may include a micro bump (uBump).

Although only one first semiconductor device 300 and four second semiconductor device 400 are illustrated in the figures, the numbers and arrangements thereof are exemplary, and may not be limited thereto. For example, the second semiconductor device 400 may include a buffer die and a plurality of memory dies (chips) sequentially stacked on the buffer die. The buffer die and the memory dies may be electrically connected to each other by through silicon vias (TSVs). Similarly, the first semiconductor device 300 may include a plurality of dies, such as memory dies, stacked on each other.

The wirings 222 may be electrically connected to through electrodes 250. The first and second semiconductor devices 300, 400 may be electrically connected to the package substrate 100 through the wirings 222 and the through electrodes 250. The first semiconductor device 300 and the second semiconductor devices 400 may be electrically connected to each other by the wirings 222.

In example embodiments, the first underfill member 350 may be underfilled between the first semiconductor device 300 and the interposer 200. The second underfill member 450 may be underfilled between the second semiconductor device 400 and the interposer 200. The third underfill member 270 may be underfilled between the interposer 200 and the package substrate 100. The first underfill member 350 may be substantially the same as the second underfill member 450. Hereinafter, detailed descriptions on the first underfill member will be omitted.

The second underfill member 450 may include a first horizontal extension 450A and a first vertical extension 450B. The first horizontal extension 450A may extend between the second semiconductor device 400 and the interposer 200 to reinforce a gap between the second semiconductor device 400 and the interposer 200. Additionally, the first vertical extension 450B may extend upwardly from the upper surface of the interposer 200 to respectively cover portions of sidewalls of the second semiconductor device 400 to firmly support the second semiconductor device 400.

The third underfill member 270 may include a second horizontal extension 270A and a second vertical extension 270B. The second horizontal extension 270A may extend between the interposer 200 and the package substrate 100 to reinforce a gap between the interposer 200 and the package substrate 100. Additionally, the second vertical extension 270B may extend upwardly from the upper surface of the package substrate 100 to respectively cover portions of sidewalls of the interposer 200 to firmly support the interposer 200.

The first to third underfill members may include a material having a relatively high fluidity to effectively fill small spaces between the first and second semiconductor devices and the interposer and between the interposer and the package substrate. For example, the first to third underfill members may include or may be formed of an adhesive including an epoxy material.

As illustrated in FIG. 2, the interposer 200 may include a first side surface S1 and a second side surface S2 extending in a direction parallel with a first direction (Y direction) which is perpendicular to the upper surface thereof and opposite to each other, and a third side surface S3 and a fourth side surface S4 extending in a direction parallel with a second direction (X direction) which is perpendicular to the first direction and opposite to each other. The interposer 200 may include first to fourth corner portions C1, C2, C3, C4.

The first semiconductor device 300 may be arranged in a middle region of the interposer 200, and the second semiconductor devices 400 may be arranged on both (e.g., opposite) sides of the first semiconductor device 300 to be adjacent to the first to fourth corner portions C1, C2, C3, C4 respectively. A first pair of the second semiconductor devices 400 may be arranged along the first side surface S1 of the interposer 200 and spaced apart from each other and the first semiconductor device 300. A second pair of the second semiconductor devices 400 may be arranged along the second side surface S2 of the interposer 200 and spaced apart from each other and the first semiconductor device 300.

Among the first pair of the second semiconductor devices 400 arranged along the first side surface S1, one of the second semiconductor devices 400 may be arranged adjacent to the first corner portion C1 and the other second semiconductor device 400 may be arranged adjacent to the fourth corner portion C4.

Among the second pair of the second semiconductor devices 400 arranged along the second side surface S2, one of the second semiconductor devices 400 may be arranged adjacent to the second corner portion C2 and the other second semiconductor device 400 may be arranged adjacent to the third corner portion C3.

The second semiconductor devices 400 may be spaced apart from the side surface or the corner portion (e.g., C1-C4) of the interposer 200 by a predetermined distance, for example, within a range of approximately 800 μm to 1000 μm. Terms such as "approximately" or "about" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

In example embodiments, the dummy member 500 may be arranged to cover at least one corner portion of the interposer 200. For example, four dummy members 500 may be arranged to cover the first to fourth corner portions C1, C2, C3, C4 of the interposer 200 respectively. The dummy member 500 may include a piece or block of conductive or semiconductive material electrically isolated from other conductive or semiconductive material of the semiconductor package 10, such as a die formed of a monolithic block of a crystalline semiconductor material, such as silicon forming a silicon substrate. The dummy member 500 may not be electrically connected to any of the first semiconductor device 300 and the second semiconductor devices 400, and may be electrically floating. Though the dummy member may be formed of a die such as a block of semiconductor material, in such a case, the dummy member does not include any circuitry formed therein or thereon and does not operate to transfer any signals or store any data. The dummy member may be referred to as a dummy block or floating block.

The dummy member 500 may be arranged to be spaced apart from the second semiconductor device 400 by a predetermined distance L. For example, the spacing distance L may be within a range of approximately 300 µm to 500 µm. The dummy member 500 may be arranged to be spaced apart from the second underfill member 450 by a predetermined distance, for example, within a range of approximately 100 µm to 300 µm. The dummy member 500 may be attached on the upper surface of the interposer 200 by adhesive films such as die attach film DAF.

The second semiconductor device 400 may have a first height H1 the same as or greater than a height of the first semiconductor device 300. The first vertical extension 450B of the second underfill member 450 may have a second height H2. The first height H1 of the second semiconductor device 400 may be approximately 700 µm or more. The second height H2 of the first vertical extension 450B of the second underfill member 450 may be 30% to 60% of the first height H1. The dummy member 500 may have a third height H3 smaller than the first height H1 of the second semiconductor device 400. The third height H3 of the dummy member 500 may be 50% to 90% of the first height H1. The third height H3 of the dummy member 500 may be within a range of approximately 300 µm to 650 µm. The third height H3 of the dummy member 500 may be greater than the second height H2 of the first vertical extension 450B of the second underfill member 450.

The first vertical extension 450B of the second underfill member 450 may have a first width W1. The first width W1 may be within a range of approximately 200 µm to 400 µm. The dummy member 500 may have a second width W2 the same as or greater than the first width W1. The second width W2 may be within a range of approximately 300 µm to 500 µm.

In example embodiments, the sealing member 600 may be provided on and in contact with the interposer 200 to cover the first and second semiconductor devices 300, 400 and the dummy member 500. The sealing member 600 may be in contact with and cover side surfaces of the first and second semiconductor devices 300, 400 and an upper surface and an inner surface of the dummy member 500.

An upper surface of the sealing member 600 may be located on the same plane as (e.g., substantially coplanar with) an upper surface of the second semiconductor device 400. The upper surface of the second semiconductor device 400 may be uncovered by the sealing member 600. An outer surface of the sealing member 600 may be located on the same plane as (e.g., substantially coplanar with) an outer surface of the dummy member 500. The outer surface 502 of the dummy member 500 may be uncovered by the sealing member 600. Accordingly, the position and structure of the dummy member 500 may be analyzed through a sidewall of the semiconductor package 10 without the sealing member 600 therebetween. The outer surface 502 of the dummy member 500 may be located on the same plane as (e.g., substantially coplanar with) the outer surface of the interposer 200. The second vertical extension 270B of the third underfill member 270 may cover a height of approximately 20% to 80% of the total height of the outer surface 502 of the dummy member 500. Terms such as "same," "equal," "planar," or "coplanar," as used herein when referring to orientation, layout, location, shapes, sizes, compositions, amounts, or other measures do not necessarily mean an exactly identical orientation, layout, location, shape, size, composition, amount, or other measure, but are intended to encompass nearly identical orientation, layout, location, shapes, sizes, compositions, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

The dummy member 500 may have a first stiffness, and the sealing member 600 may have a second stiffness less than the first stiffness. The first to third underfill members may have a third stiffness less than the first stiffness.

Outer connection pads, although not illustrated in the figures, may be formed on the lower surface of the package substrate 100, and outer connection members 130 for an electrical connection with an external device may be disposed on the outer connection pads. The outer connection members 130 may be, for example, solder balls. The semiconductor package 10 may be mounted on a module substrate by the solder balls, thus constituting a memory module.

Although it is not illustrated in the figures, the semiconductor package 10 may further include a second sealing member provided on the package substrate 100 to cover the interposer 200, the first semiconductor device 300 and the second semiconductor devices 400. However, the outer surface 502 of the dummy member 500 may be uncovered by the second sealing member. Additionally, the semiconductor package 10 may further include a stiffener provided on the package substrate 100, a heat sink provided on the first and second semiconductor devices 300, 400, etc.

Although only some substrate pads, the first bonding pads and the second bonding pads are illustrated in the figures, it may be understood that the first bonding pads and the second bonding pads are exemplary, and thus, may not be limited thereto.

As mentioned above, the semiconductor package 10 may include the interposer 200, the first and second semiconductor devices 300, 400 arranged on the interposer 200, the at least one dummy member 500 covering at least one corner portion C1, C2, C3, C4 of the interposer 200, and the sealing member 600 on the interposer 200 to cover the first and second semiconductor devices 300, 400 and the dummy member 500. The height of the dummy member 500 may be less than the height of the second semiconductor device 400. The upper surface of the dummy member 500 may be covered by the sealing member 600, and the outer surface 502 of the dummy member 500 may be uncovered by the sealing member 600.

During a reliability test such as a temperature cycle (TC) test, the dummy member 500 may act as a barrier against bending stress that causes a failure, to thereby prevent occurrence of cracks between the second underfill member 450 and the sealing member 600. Thus, it may be possible to improve the reliability of the 2.5D package.

Hereinafter, a method of manufacturing the semiconductor package in FIG. 1 will be explained.

FIGS. 4 to 16 are cross-sectional views illustrating a method of manufacturing a semiconductor package in accordance with example embodiments. FIGS. 5 to 11 and 13 to 16 are cross-sectional views taken along the line C-C' in FIG. 4. FIG. 12 is an enlarged plan view illustrating portion 'D' in FIG. 4.

Figure 4:
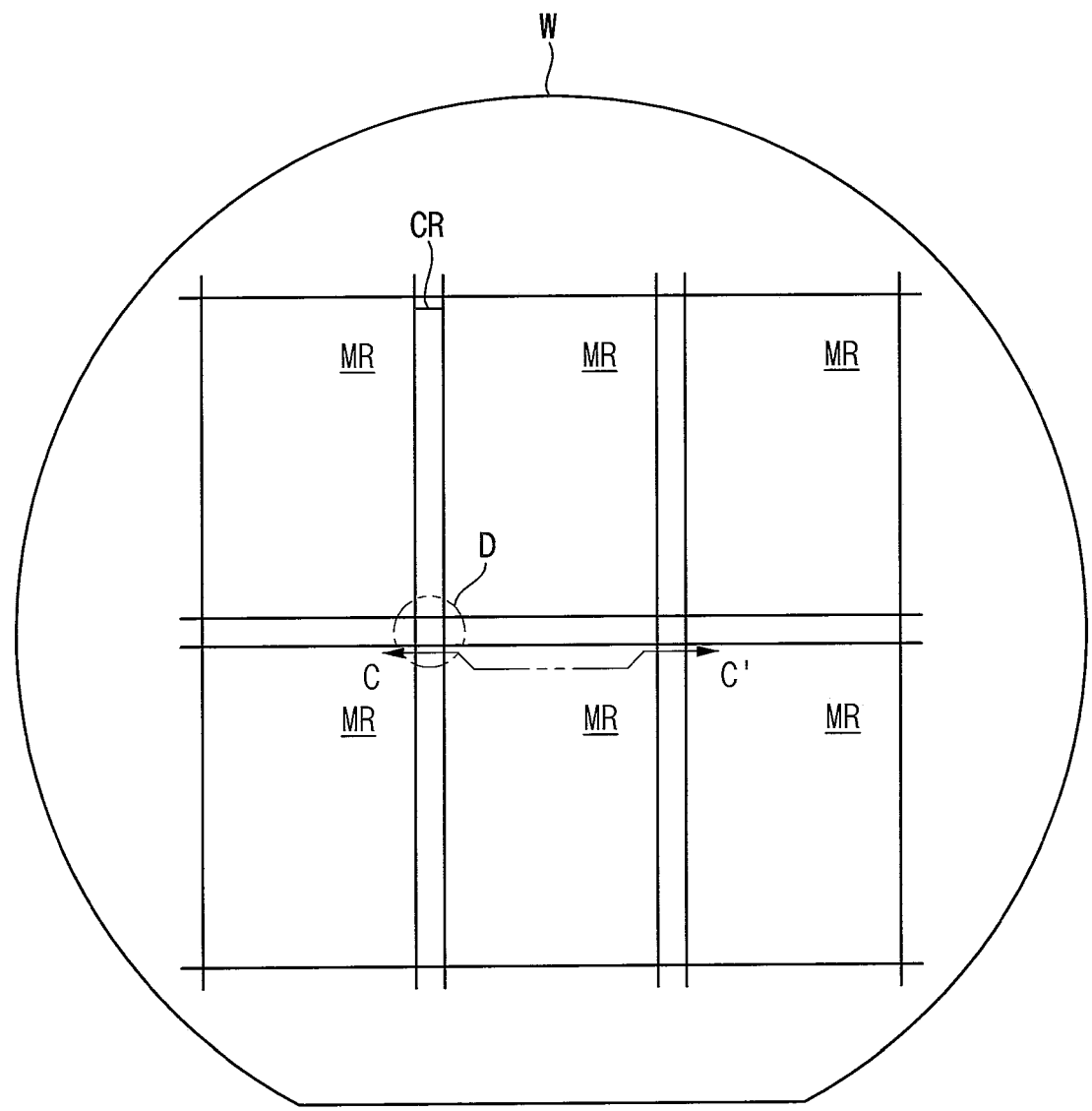
Figure 5:
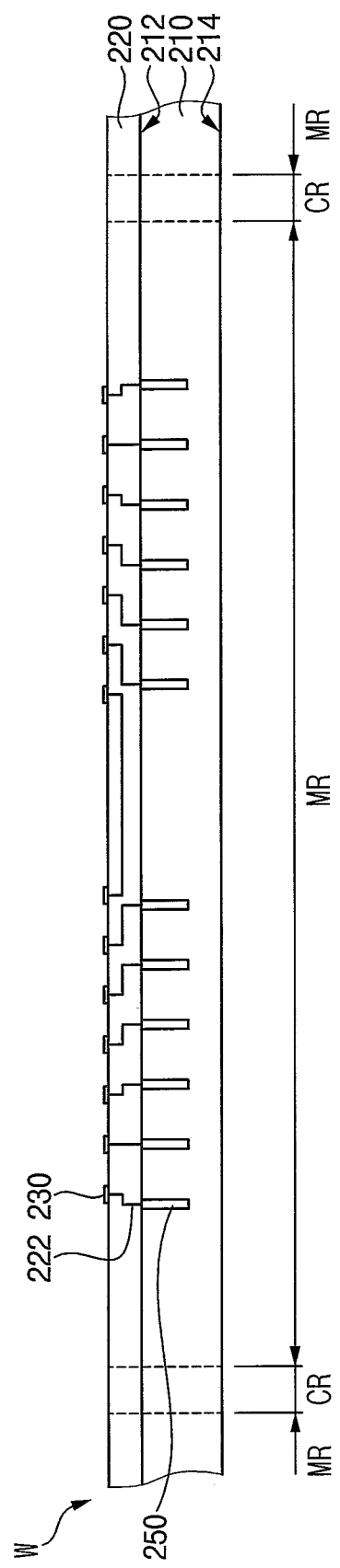

Referring to FIGS. 4 and 5, first, a semiconductor wafer W for a base structure may be prepared.

In example embodiments, the base structure may include a silicon interposer. Alternatively, the base structure may include a semiconductor die in which a logic chip or a memory chip is implemented.

The wafer W may include a substrate 210 and a wiring layer 220. The wiring layer 220 may be provided on a first surface 212 of the substrate 210. The wafer W may include a package region, that is, a mounting region MR where semiconductor device(s) are mounted and a scribe lane region, that is, a cutting region CR surrounding the mounting region MR. As described later, the wafer W may be cut along the cutting region CR dividing the mounting regions MR to form an individual interposer. For example, the mounting region MR may have an area of 20 mm×30 mm or more.

For example, the substrate 210 may include or may be formed of silicon, germanium, silicon-germanium, or III-V compounds, e.g., GaP, GaAs, GaSb, etc. In some embodiments, the substrate 210 may be a silicon-on-insulator (SOI) substrate, or a germanium-on-insulator (GOI) substrate.

The wiring layer 220 may be formed on the first surface 212 of the substrate 210. The wiring layer 220 may be formed by a back process referred to as BEOL (Back End of Line) process. The wiring layer 220 may include a plurality of insulation layers and a plurality of wirings 222 in the insulation layers. For example, the wirings 222 may include or may be formed of a metal such as copper (Cu).

The substrate 210 may include a plurality of through electrodes (through silicon vias) 250 which are formed to penetrate through the substrate. The through electrodes 250 may be electrically connected to the wirings 222 respectively. The through electrodes 250 may be formed before grinding a backside of the substrate 210, that is, a second surface 214 (via first, via middle process). Alternatively, the through electrodes 250 may be formed after grinding the backside of the substrate 210 (via last process)

First bonding pads 230 may be provided in the outermost insulation layer of the wiring layer 220. The through electrodes 250 may be electrically connected to the first bonding pads 230 through the wiring 222.

Figure 6:
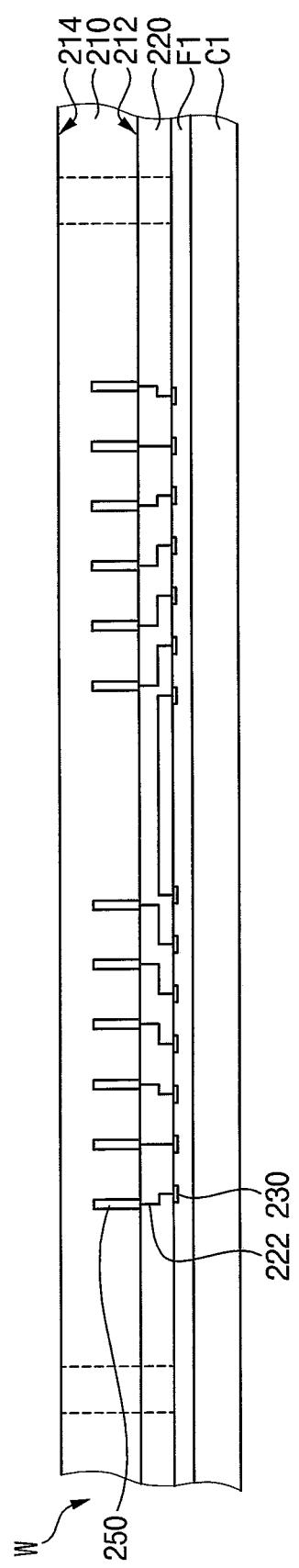
Figure 7:
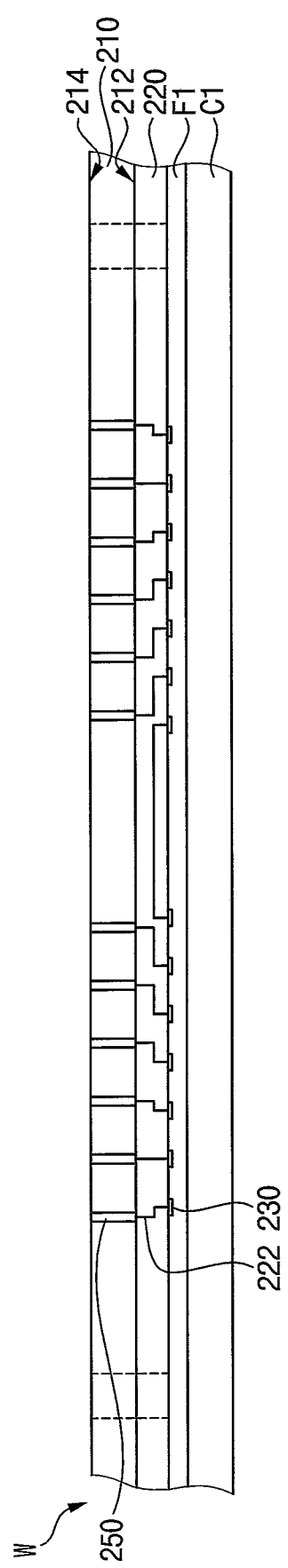
Figure 8:
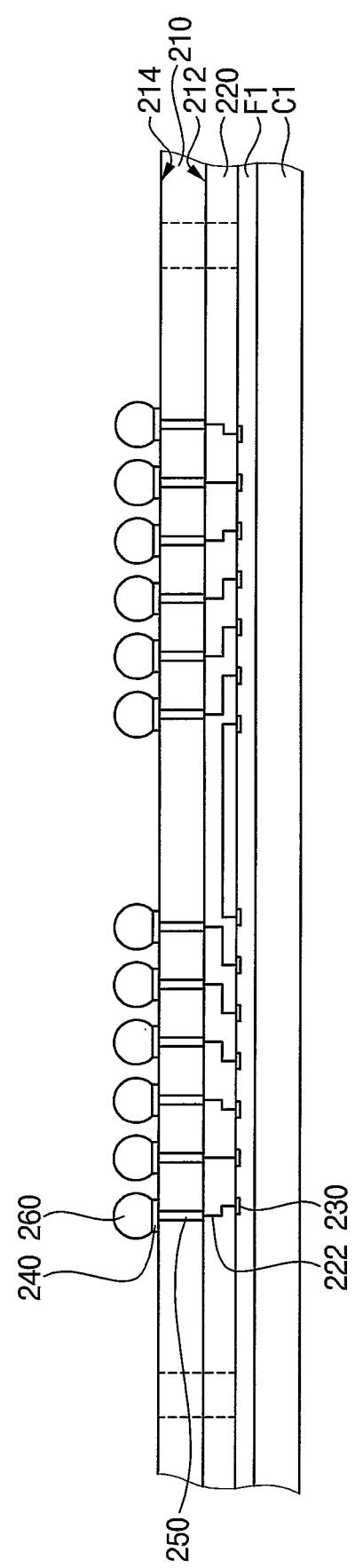

Referring to FIGS. 6 to 8, second bonding pads 240 may be formed on the second surface 214 of the substrate 210, and solder bumps 260 as a conductive connection member may be formed on the second bonding pad 240.

As illustrated in FIGS. 6-8, the orientation of the structure in FIG. 5 may be reversed. As illustrated in FIGS. 6 and 7, the backside of the substrate 210, that is, the second surface 214 may be grinded using a substrate support, such as a Wafer Support System (WSS). The wafer W may be adhered on a carrier substrate C1 using a first adhesive film F1 in between and in contact with the wiring layer 220 and the carrier substrate C1. The second surface 214 of the substrate 210 may be grinded until portions of the through electrodes 250 are exposed.

The second surface 214 of the substrate 210 may be partially removed by a grinding process such as a chemical mechanical polishing CMP process. Thus, a thickness of the substrate 210 may be reduced to a desired thickness. For example, the substrate 210 may have a thickness range of about 50 μm to 100 μm. The portions of the through electrodes 250 may be exposed from the second surface 214 of the substrate 210.

As illustrated in FIG. 8, the second bonding pads 240 may be formed on the second surface 214 of the substrate 210 to be electrically connected to the through electrodes 250, and the solder bumps 260 may be formed on the second bonding pads 240.

The second bonding pads 240 may be formed by forming a seed layer and a photoresist layer on the second surface 214 of the substrate 210, performing an exposure process on the photoresist layer to form a photoresist pattern having an opening that exposes a portion of the seed layer, and performing a plating process on the seed layer.

For example, the second bonding pads 240 may have a diameter of approximately 70 μm to 80 μm. The diameter of the second bonding pads 240 may be at least three times a diameter of the first bonding pads 230.

Then, the solder bumps 260 may be formed on the second bonding pads 240.

In particular, a seed layer may be formed on the second bonding pads 240 on the second surface 214 of the substrate 210, and a photoresist pattern having an opening that expose a portion of the seed layer may be formed on the second surface 214 of the substrate 210.

Then, the opening of the photoresist pattern may be filled with a conductive material, and then, the photoresist pattern may be removed and a reflow process may be performed to form the solder bumps 260. For example, the conductive material may be formed by a plating process. Alternatively, the solder bumps 260 may be formed by a screen printing process, a deposition process, etc.

The carrier substrate C1 may be removed from the wafer W such that the first bonding pads 230 are exposed.

Figure 9:
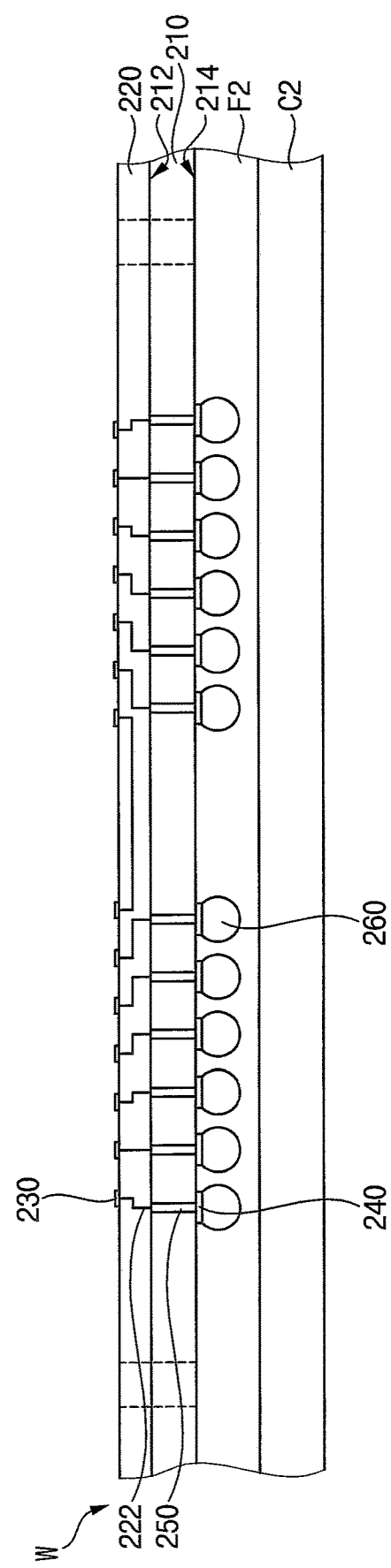
Figure 10:
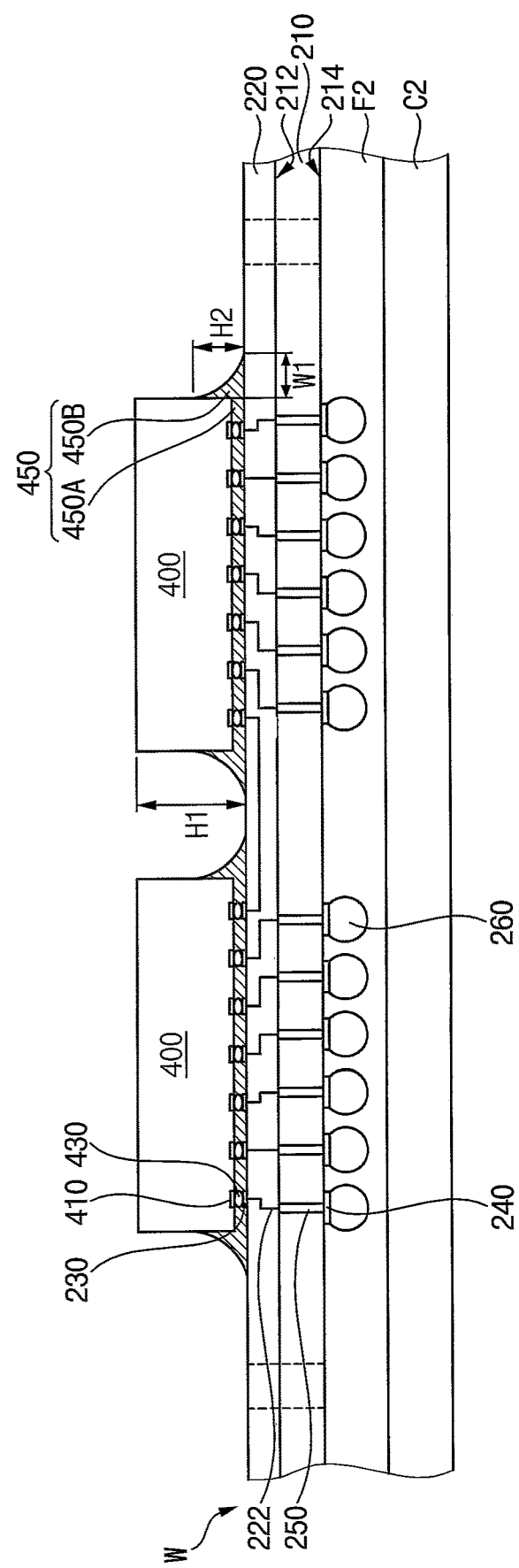

Referring to FIGS. 9 and 10, the orientation of the structure in FIG. 8 may be reversed, and a first semiconductor device (300, see FIG. 1) and second semiconductor devices 400 may be mounted on the wiring layer 220. Then, a first underfill member 350 may be formed between the first semiconductor device 300 and the wiring layer 220 and a second underfill member 450 may be formed between the second semiconductor device 400 and the wiring layer 220.

As illustrated in FIG. 9, the wafer W may be adhered on a second carrier substrate C2 using a second adhesive film F2. The wafer W may be adhered on the second carrier substrate C2 such that the second adhesive film F2 is in between and in contact with the second surface 214 of the substrate 210 and the second carrier substrate C2.

As illustrated in FIG. 10, the first semiconductor device 300 and the second semiconductor devices 400 may be arranged on the wiring layer 220 to be spaced apart from each other. The first semiconductor device 300 may be arranged in a middle region of the mounting region MR, and the second semiconductor devices 400 may be arranged on both sides of the first semiconductor device 300 to be adjacent to corner portions of the mounting region MR respectively.

In example embodiments, the first semiconductor device 300 and the second semiconductor devices 400 may be mounted on the wiring layer 220 in a flip chip bonding manner. Chip pads 410 of the second semiconductor devices 400 may be electrically connected to the first bonding pads 230 of the wiring layer 220 by conductive bumps 430. For example, the conductive bumps 430 may include micro bump (uBump). Although not illustrated, chip pads of the first semiconductor device 300 may be electrically connected to the first bonding pads 230 of the wiring layer 220 by conductive bumps in a manner similar to that of the second semiconductor devices 400.

For example, the first semiconductor device 300 may include a logic semiconductor device, and the second semiconductor devices 400 may include a memory device. The logic semiconductor device may include a CPU, a GPU, an ASIC, or an SOC. The memory device may include a high bandwidth memory (HBM) device. In this case, the second semiconductor devices 400 may include a buffer die and a plurality of memory dies (chips) sequentially stacked on the buffer die. The buffer die and the memory dies may be electrically connected to each other by through silicon vias.

Then, an underfill solution may be dispensed between the first semiconductor device 300 and the wiring layer 220 and between the second semiconductor devices 400 and the wiring layer 220 while moving a dispenser nozzle along edges of the first and second semiconductor devices 300, 400. The underfill solution may be cured to form the first underfill member (350, see FIG. 2) and the second underfill member 450.

The second underfill member 450 may include first horizontal extensions 450A extending between the second semiconductor device 400 and the wiring layer 220 to reinforce a gap between the second semiconductor device 400 and the wiring layer 220. Additionally, the second underfill member 450 may include first vertical extensions 450B respectively covering portions of sidewalls of the second semiconductor device 400 to firmly support the second semiconductor device 400.

The first and second underfill members 350, 450 may include a material having a relatively high fluidity to effectively fill a small space between the first and second semiconductor devices 300, 400 and the wiring layer 220. For example, the first and second underfill members 350, 450 may include or may be formed of an adhesive including an epoxy material.

The second semiconductor device 400 may have a first height H1 the same as or greater than a height of the first semiconductor device 300. The first vertical extension 450B of the second underfill member 450 may have a second height H2. The first height H1 of the second semiconductor device 400 may be approximately 700 μm or more. The second height H2 of the first vertical extension 450B of the second underfill member 450 may be approximately 30% to 60% of the first height H1. The first vertical extension 450B of the second underfill member 450 may have a first width W1. The first width W1 may be within a range of approximately 200 μm to 400 μm.

Figure 11:
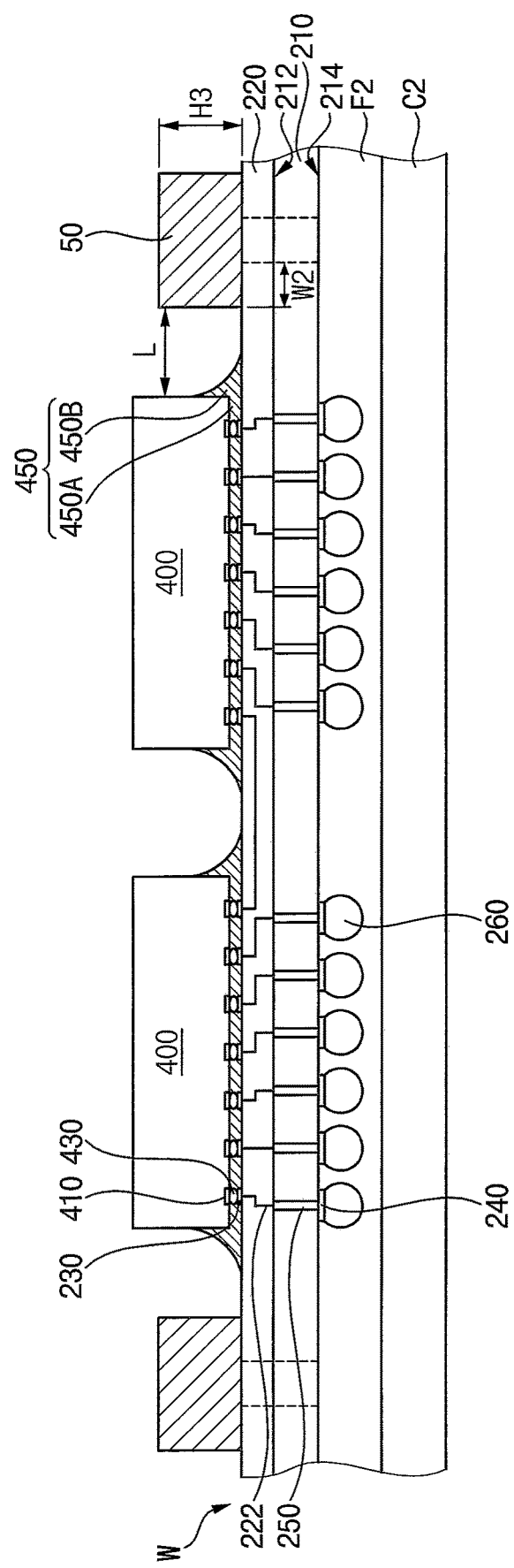
Figure 12:
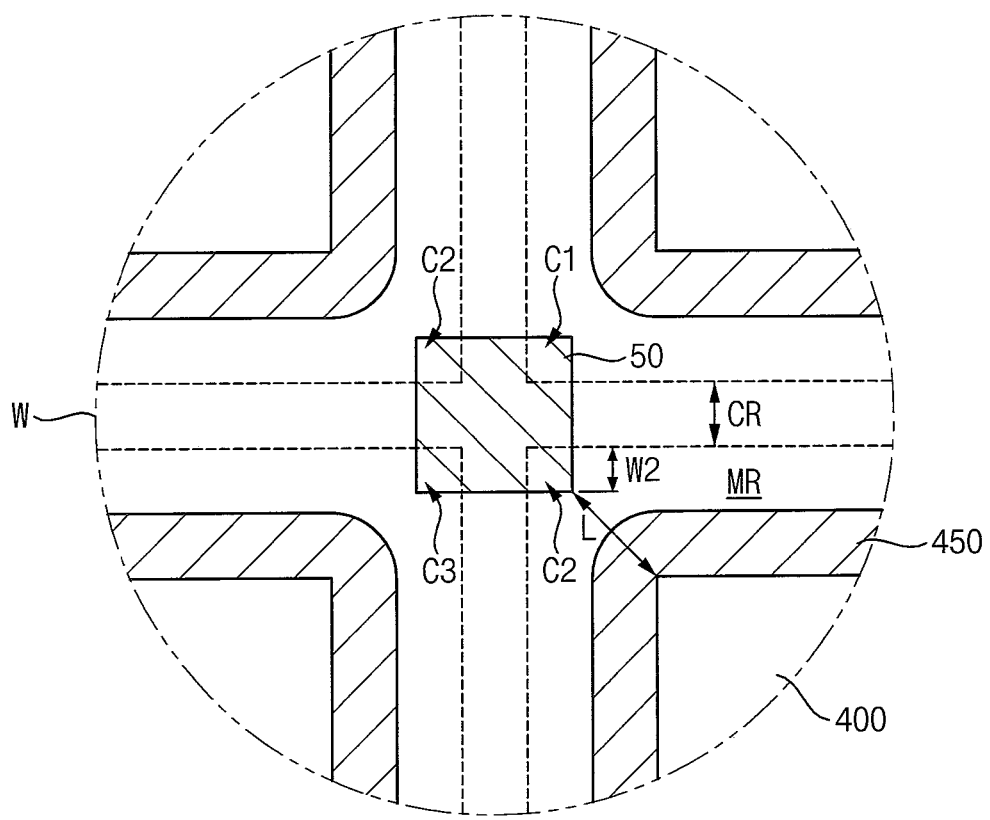

Referring to FIGS. 11 and 12, dummy substrates 50 may be disposed to cover the corner portions C1, C2, C3, C4 of the mounting region MR along the cutting region CR of the wafer W1, respectively.

In example embodiments, the dummy substrates 50 may be disposed on the wiring layer 220 to cover the first to fourth corner portions C1, C2, C3, C4 of the mounting region MR, respectively. The dummy substrates 50 may be attached on the wiring layer 220 by adhesive films such as die attach film DAF. For example, the dummy substrate 50 may include a silicon substrate.

The dummy substrate 50 may be arranged to be spaced apart from the second semiconductor device 400 by a predetermined distance L. The spacing distance L may be within a range of 300 μm to 500 μm. A width W2 of the corner portion of the mounting area MR covered by the dummy substrate 50 may be within a range of approximately 300 μm to 500 μm. The second semiconductor device 400 may be spaced apart from the edge of the mounting region MR by a predetermined distance, for example, within a range of approximately 300 μm to 500 μm. The dummy substrate 50 may have a third height H3 smaller than the first height H1 of the second semiconductor device 400. The third height H3 of the dummy substrate 50 may be within a range of approximately 300 μm to 650 μm.

Figure 13:
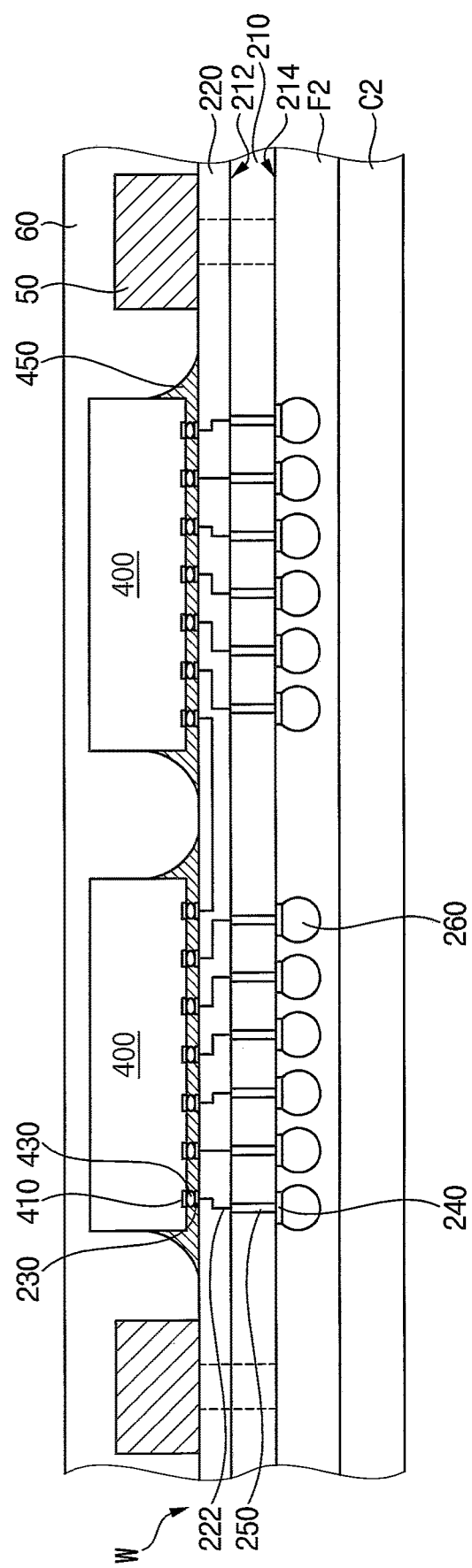
Figure 14:
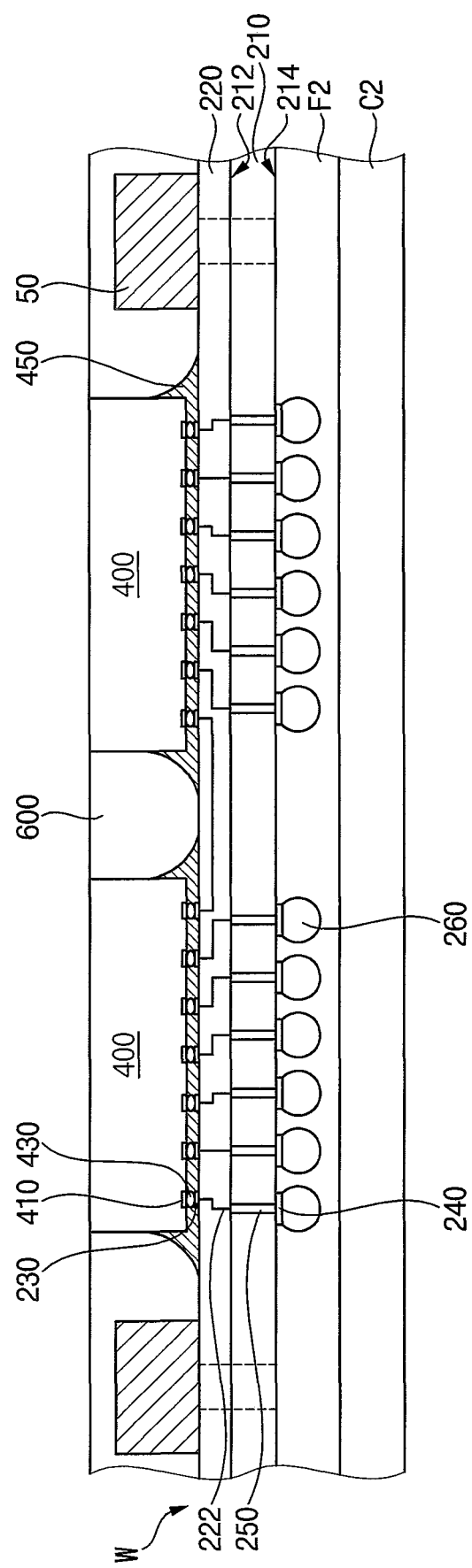

Referring to FIGS. 13 and 14, a sealing material 60 may be formed on the wiring layer 220 to cover the first semiconductor device 300, the second semiconductor devices 400 and the dummy substrates 50.

In example embodiments, after forming the sealing material 60 covering the first and second semiconductor devices 300, 400 and the dummy substrates 50 on the wiring layer 220, the sealing material 60 may be partially removed to form a sealing member 600 and to expose upper surfaces of the second semiconductor devices 400.

An upper surface of the sealing member 600 may be positioned on the same plane as (e.g., substantially coplanar with) the upper surface of the second semiconductor device 400. An upper surface and at least some of the side surfaces of the dummy substrate 50 may be covered by the sealing member 600.

Figure 15:
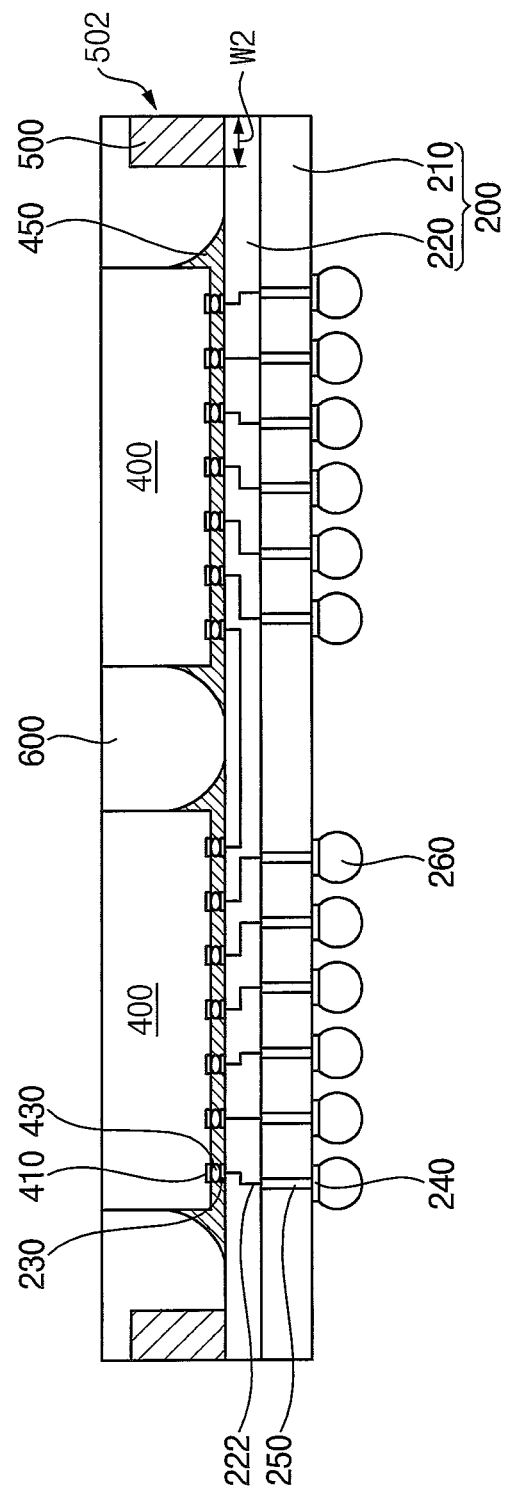

Referring to FIG. 15, the wafer W may be cut along the cutting region CR to form the individual interposer 200.

In example embodiments, when the wafer W is sawed by a sawing process, a portion of the dummy substrate 50 in the cutting region CR may also be sawed to form a dummy member 500.

The dummy members 500 may be formed on the first to fourth corner portions C1, C2, C3, C4 (see FIG. 2) of the interposer 200, respectively. The dummy member 500 may be arranged to be spaced apart from the second semiconductor device 400 by a predetermined distance L. The spacing distance L may be within a range of approximately 300 μm to 500 μm. A width W2 of the dummy member 500 may be within a range of approximately 300 μm to 500 μm. The dummy member 500 may have a third height H3 smaller than the first height H1 of the second semiconductor device 400. The third height H3 of the dummy member 500 may be within a range of approximately 300 μm to 650 μm.

A sealing member 600 may cover an upper surface and an inner surface of the dummy member 500. An outer surface 502 of the dummy member 500 may be uncovered by the sealing member 600. The outer surface 502 of the dummy member 500 may be located on the same plane as (e.g., substantially coplanar with) an outer surface of the interposer 200.

Figure 16:
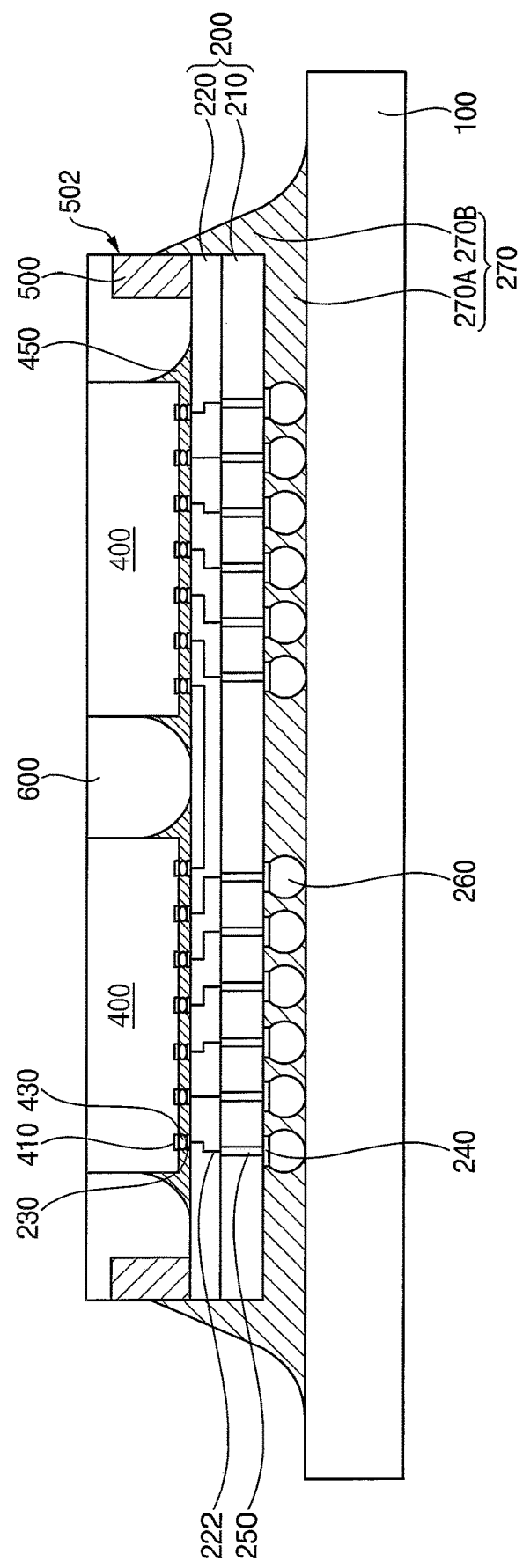

Referring to FIG. 16, the interposer 200 on which the first and second semiconductor devices 300, 400 and the dummy member 500 are mounted may be disposed on a package substrate 100. Then, a third underfill member 270 may be formed between the interposer 200 and the package substrate 100.

In example embodiments, the interposer 200 may be mounted on the package substrate 100 through the solder bumps 260. The interposer 200 may be attached on the package substrate 100 by a thermal compression process.

Then, an underfill solution may be dispensed between the interposer 200 and the package substrate 100 while moving a dispenser nozzle along edges of the interposer 200, and the underfill solution may be cured to form the third underfill member 270.

The third underfill member 270 may include a second horizontal extension 270A extending between the interposer 200 and the package substrate 100 to reinforce a gap between the interposer 200 and the package substrate 100. Additionally, the third underfill member 270 may include second vertical extensions 270B respectively covering portions of sidewalls of the interposer 200 to firmly support the interposer 200. Accordingly, the third underfill member 270 may cover at least a portion of the outer surface of the dummy member 500 not covered by the molding member 600.

Then, outer connection members such as solder balls may be formed on outer connection pads on a lower surface of the package substrate 100 to complete the semiconductor package 10 in FIG. 1.

Figure 17:
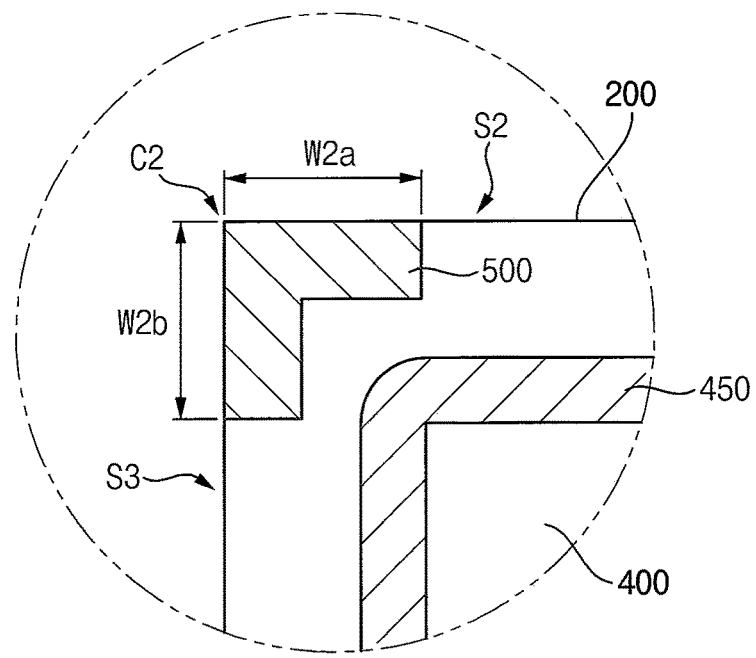

FIG. 17 is a plan view illustrating a dummy member 500 in accordance with example embodiments.

Referring to FIG. 17, a dummy member 500 may be arranged to cover a second corner portion C2 of an interposer 200. The dummy member 500 may include a first portion extending in a first direction along the second side surface S2 from the second corner portion C2 and a second portion extending in a second direction along the third side surface S3 from the second corner portion C2.

The first portion may extend from the second corner portion C2 by a third width W2a, and the second portion may extend from the second corner portion C2 by a fourth width W2b. The third width W2a of the first portion may be defined as a width of the dummy member 500 in the first direction (Y direction), and the fourth width W2b of the second portion may be defined as a width of the dummy member 500 in the second direction (X direction). The third width W2a and the fourth width W2b may be determined in consideration of bending stress acting on the interposer 200, dimensions of the interposer 200, etc.

Figure 18:
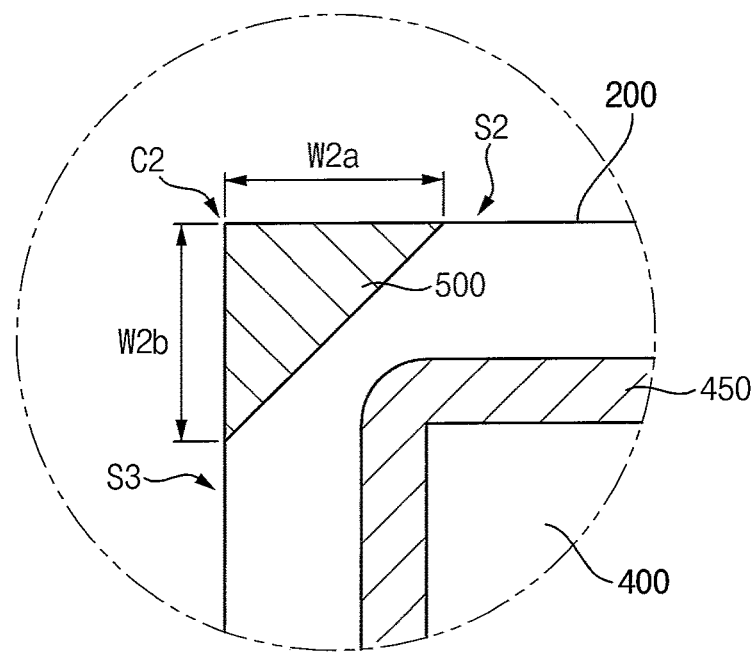
Figure 19:
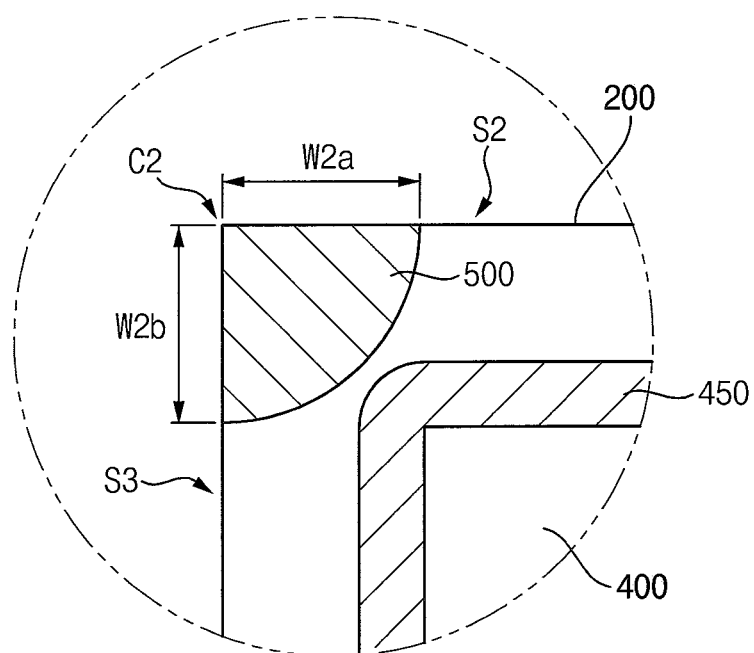

FIGS. 18 and 19 are plan views illustrating a dummy member in accordance with example embodiments.

Referring to FIGS. 18 and 19, a dummy member 500 may be arranged to cover a second corner portion C2 of an interposer 200. The dummy member 500 may have a right triangle shape or a fan shape. A width of the dummy member 500 may gradually decrease as it moves away from the second corner portion C2. For example, a width W2a of the dummy member 500 in a first direction (Y direction) may gradually decrease as it moves away from a second side surface S2 of the interposer 200, and a width W2b of the dummy member 500 in a second direction (X direction) may gradually decrease as it moves away from a third side surface S3 of the interposer 200.

FIG. 20 is a cross-sectional view illustrating a semiconductor package in accordance with example embodiments. The semiconductor package may be substantially the same as or similar to the semiconductor package described with reference to FIGS. 1 to 3 except for arrangements of first and second semiconductor devices. Thus, same reference numerals will be used to refer to the same or like elements and any further repetitive explanation concerning the above elements will be omitted.

Referring to FIG. 20, an interposer of a semiconductor package 11 may include two first semiconductor devices 300 and eight second semiconductor devices 400.

The two first semiconductor devices 300 may be arranged in a middle region of the interposer 200 to be spaced apart from each other. Four second semiconductor devices 400 may be arranged on a first side of the two first semiconductor devices 400 along the first side surface S1 and spaced apart from each other. Another four second semiconductor devices 400 may be arranged on a second side, opposite to the first side, of the two first semiconductor devices 400 along the second side surface S2 and spaced apart from each other.

Among the four second semiconductor devices 400 arranged along the first side surface S1, the second semiconductor device 400 adjacent to the third side surface S3 may be arranged adjacent to the first corner portion C1 and the second semiconductor device 400 adjacent to the fourth side surface S4 may be arranged adjacent to the fourth corner portion C4.

Among the four second semiconductor devices 400 arranged along the second side surface S2, the second semiconductor device 400 adjacent to the third side surface S3 may be arranged adjacent to the second corner portion C2 and the second semiconductor device 400 adjacent to the fourth side surface S4 may be arranged adjacent to the third corner portion C3.

Although it is not illustrated in the figures, the semiconductor package 11 (and previously discussed embodiments of the semiconductor package) may further include a second dummy member provided to cover an edge portion between the corner portions. The second dummy member may be arranged to be spaced apart from the second semiconductor device 400 by a predetermined distance. For example, a second dummy member may be arranged adjacent to the first side surface S1 between the first corner portion C1 and the fourth corner portion C4; a second dummy member may be arranged adjacent to the second side surface S2 between the second corner portion C2 and the third corner portion C3; a second dummy member may be arranged adjacent to the third side surface S3 between the first corner portion C1 and the second corner portion C2; and a second dummy member may be arranged adjacent to the fourth side surface S4 between the fourth corner portion C4 and the third corner portion C3. One or more second dummy members may be provided. An outer surface of the second dummy member may be uncovered by a sealing member. The outer surface of the second dummy member may be located on the same plane as (e.g., substantially coplanar with) an outer surface of the interposer 200. A second vertical extension of a second underfill member may cover at least a portion of the outer surface of the second dummy member uncovered by the sealing member.

The semiconductor package may include semiconductor devices such as logic devices or memory devices. The semiconductor package may include logic devices such as central processing units (CPUs), main processing units (MPUs), or application processors (APs), or the like, and volatile memory devices such as DRAM devices, HBM devices, or non-volatile memory devices such as flash memory devices, PRAM devices, MRAM devices, ReRAM devices, or the like.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the present invention. Accordingly, all such modifications are intended to be included within the scope of example embodiments as defined in the claims.

What is claimed is:

1. A semiconductor package, comprising:
a package substrate having a top surface and a bottom surface opposite to the top surface;
an interposer provided on the top surface of the package substrate;
a plurality of semiconductor devices on the interposer and spaced apart from each other, and electrically connected to each other through the interposer;
at least one dummy member on the interposer to cover at least one corner portion of the interposer and arranged spaced apart from a first semiconductor device among the plurality of semiconductor devices; and a sealing member contacting the interposer and filling a space between the first semiconductor device and the at least one dummy member so as to cover a first side surface of the first semiconductor device, a first side surface of the at least one dummy member, and an upper surface of the at least one dummy member, wherein a second side surface, opposite to the first side surface, of the at least one dummy member is uncovered by the sealing member; and wherein, in a direction perpendicular to the top surface of the package substrate, a height of the at least one dummy member is less than a height of the first semiconductor device.

2. The semiconductor package of claim 1, wherein, in a direction perpendicular to the top surface of the package substrate, the height of the at least one dummy member is within a range of 50% to 90% of the height of the first semiconductor device.

3. The semiconductor package of claim 1, wherein, in a direction parallel to the top surface of the package substrate, a width of the at least one dummy member is within a range of 300 μm to 500 μm.

4. The semiconductor package of claim 1, wherein a spacing distance between the first semiconductor device and the at least one dummy member is within a range of 300 μm to 500 μm.

5. The semiconductor package of claim 1, further comprising:
a first underfill member interposed between the first semiconductor device and the interposer, and including a first vertical extension covering a portion of the first side surface of the first semiconductor device.

6. The semiconductor package of claim 5, wherein the at least one dummy member is arranged spaced apart from the first vertical extension.

7. The semiconductor package of claim 5, wherein, in a direction parallel to the top surface of the package substrate, a width of the first vertical extension is within a range of 200 μm to 400 μm.

8. The semiconductor package of claim 1, further comprising:
a second underfill member interposed between the interposer and the package substrate, and including a second vertical extension covering a portion of the second side surface of the at least one dummy member.

9. The semiconductor package of claim 1, wherein the at least one dummy member includes a silicon material.

10. A semiconductor package, comprising:
a package substrate having a top surface and a bottom surface opposite to the top surface;
an interposer arranged on the top surface of the package substrate, and having a plurality of first bonding pads and second bonding pads provided respectively on a first surface and a second surface opposite to each other and electrically connected to each other;
a plurality of semiconductor devices on the first surface of the interposer, arranged spaced apart from each other, and electrically connected to the first bonding pads;
an underfill member interposed between the semiconductor devices and the first surface of the interposer, and including a vertical extension covering a portion of a sidewall of the semiconductor devices;
at least one dummy member on the first surface of the interposer covering at least one corner portion of the interposer and arranged spaced apart from a first semiconductor device among the plurality of semiconductor devices and the underfill member; and
a sealing member contacting the first surface of the interposer and filling a space between the first semiconductor device and the at least one dummy member so as to contact the vertical extension covering a portion of a sidewall of the first semiconductor device, contact the sidewall of the first semiconductor device, contact an upper surface of the at least one dummy member, and contact a first side surface of the at least one dummy member, wherein a second side surface, opposite to the first side surface, of the at least one dummy member is not contacting the sealing member, and wherein, in a direction perpendicular to the top surface of the package substrate, a height of the at least one dummy member is less than a height of the first semiconductor device.

11. The semiconductor package of claim 10, wherein an upper surface of the sealing member is coplanar with an upper surface of the first semiconductor device, and a portion of the sealing member contacting the upper surface of the at least one dummy member being coplanar with the second side surface of the at least one dummy member.

12. The semiconductor package of claim 10, wherein, in a direction perpendicular to the top surface of the package substrate, a height of the at least one dummy member is within a range of 50% to 90% of a height of the first semiconductor device.

13. The semiconductor package of claim 10, wherein a spacing distance between the first semiconductor device and the at least one dummy member is within a range of 300 μm to 500 μm.

14. The semiconductor package of claim 10, wherein, in a direction parallel to the top surface of the package substrate, a width of the vertical extension is within a range of 200 μm to 400 μm.

15. The semiconductor package of claim 10, wherein the at least one dummy member has a first stiffness, and the sealing member has a second stiffness less than the first stiffness.

16. The semiconductor package of claim 10, further comprising:
a second underfill member interposed between the second surface of the interposer and the package substrate, and including a second vertical extension contacting a portion of the second side surface of the at least one dummy member.

17. A semiconductor package, comprising:
a package substrate having a top surface and a bottom surface opposite to the top surface;
an interposer provided on the top surface of the package substrate;
a first semiconductor device arranged in a middle region of the interposer;
a second semiconductor device arranged on a side of the first semiconductor device on the interposer;
a first underfill member interposed between the second semiconductor device and the interposer, and including a first vertical extension covering a portion of a sidewall of the second semiconductor device;
at least one dummy block on the interposer covering at least one corner portion of the interposer and arranged spaced apart from the second semiconductor device and the first underfill member;
a sealing member contacting the interposer and filling a space between the second semiconductor device and the at least one dummy block so as to cover a portion of the sidewall of the second semiconductor device, a first sidewall of the at least one dummy block, and upper surface of the at least one dummy block; and a second underfill member interposed between the interposer and the package substrate, and including a second vertical extension covering a portion of a second sidewall, opposite to the first sidewall, of the at least one dummy block, wherein the second sidewall of the at least one dummy block is uncovered by the sealing member, and wherein, in a direction perpendicular to the top surface of the package substrate, a height of the at least one dummy block is within a range of 50% to 90% of a height of the second semiconductor device.

18. The semiconductor package of claim 17, wherein, in a direction parallel to the top surface of the package substrate, a width of the at least one dummy block is within a range of 300 μm to 500 μm.

19. The semiconductor package of claim 17, wherein the at least one dummy block includes a silicon material.

* * * * *